United States Patent [19]

Laupman

[11] 4,213,515

[45] Jul. 22, 1980

[54] SPEAKER SYSTEM

[75] Inventor: Robert R. Laupman, Wijchen, Netherlands

[73] Assignee: Novanex Automation N.V., Wijchen, Netherlands

[21] Appl. No.: 941,743

[22] Filed: Sep. 12, 1978

[30] Foreign Application Priority Data

Sep. 15, 1977 [NL] Netherlands ........................ 7710136

[51] Int. Cl.[2] ................................................ H05K 5/00

[52] U.S. Cl. .................................... 181/145; 181/146; 181/151; 181/156; 181/199

[58] Field of Search ................................ 181/144–156, 181/199, 192; 179/1 E

[56] References Cited

U.S. PATENT DOCUMENTS

| | | | |
|---|---|---|---|
| 3,729,061 | 4/1973 | Tamura | 181/146 |
| 3,892,288 | 7/1975 | Klayman et al. | 181/156 |

FOREIGN PATENT DOCUMENTS

| | | | |
|---|---|---|---|
| 278736 | 11/1964 | Netherlands | 179/1 E |
| 337264 | 10/1930 | United Kingdom | 181/156 |

OTHER PUBLICATIONS

Publication "Vented Loudspeaker" by C. T. Chapman p. 398 Wireless World, Oct. 1949.

Publication "Loudspeakers in Vented Boxes" by A. N. Thiele p. 391 Journal of the Audio Engineering Society, May 1971 vol. 19, No. 5.

*Primary Examiner*—L. T. Hix
*Assistant Examiner*—Benjamin R. Fuller

[57] ABSTRACT

A speaker system comprises an enclosure and at least one speaker mounted therein. The enclosure includes at least one duct connecting the interior of the enclosure directly with the outer air at the front thereof. Each duct is confined at least at one side by a member extending substantially normal to and running substantially the width of the front of the enclosure. The member has its front and/or rear edge rounded so that the cross-sectional dimension of the opening of the duct at the respective edge is greater than that of the central section of the duct.

2 Claims, 2 Drawing Figures

SPEAKER SYSTEM

Speaker systems employing one or more speakers mounted in an enclosure are known to require that, for giving the auditor a uniform sound impression, the lower frequencies of the signals produced by the speakers are of considerably larger amplitude than, for example, the centre and higher frequencies.

Several measures have been proposed for adjusting the amplitude in dependence upon the frequency so that an essentially uniform sound impression throughout the entire audible range of frequencies is achieved.

These proposals, however, entail a number of drawbacks. Some are so complex that the effect contemplated can be achieved only by means of a large number of additional components and a complicated structure. Other proposals are less complex but they result either in an incomplete achievement of the object contemplated or in the occurrence of side effects that at least partly nullify the effect achieved.

In one of these proposals the enclosure is provided with at least one duct connecting the interior of the enclosure directly with the outer air at the front thereof. Particularly, the front of the enclosure is provided with one or more openings to which ducts, especially pipe sections, mounted within the enclosure are connected to extend a certain distance into the interior thereof.

Although such a structure results indeed in an increase in the output of the speaker system to the effect that the reproduction of lower frequencies is of better quality than in the event that the enclosure only comprises one or more speakers, this structure entails the drawback that during operation of the system air omnilaterally entering the pipe flows out of this pipe as a jet stream. This non-symmetrical in-and outflow of air results in a particularly annoying rattling sound effect.

To eliminate this rattling sound, at least one of the ends of the pipe may be provided with a horn. It is true this results in at least a reduction of this effect but, as for lower frequencies not only the length of the horn but also the circumferential dimension of its mouth must be considerable, the application of this measure to speaker boxes has structural drawbacks, especially from the point of view of the space required therefor.

It is an object of the invention to eliminate the rattling effect in a manner lacking such drawbacks.

To this end, in accordance with the invention each duct is confined at least at one side by a member extending substantially normal to and running substantially the width of the front of the enclosure, this member having its front and/or rear edge rounded so that the cross-sectional dimension of the opening of the duct at the respective edge is greater than that of the central section of the duct.

In a preferred embodiment of the invention, each duct comprises two substantially parallel members extending substantially normal to and running substantially the width of the front of the enclosure, these members having their front and/or rear edges rounded so that the cross-sectional dimension of the opening of the duct at the respective edges is greater than that of the central section of the duct.

Practice has shown that an optimum result is achieved if the rounding is selected so that the cross-sectional dimension of the opening of the duct at the respective edge or edges is at least one and a half times that of the central section of the duct.

The invention will now be described in greater detail with reference to the accompanying drawings, in which:

FIG. 1 shows a speaker system according to the invention comprising an enclosure 1 having its front covered with a cloth 2.

Figure 1:
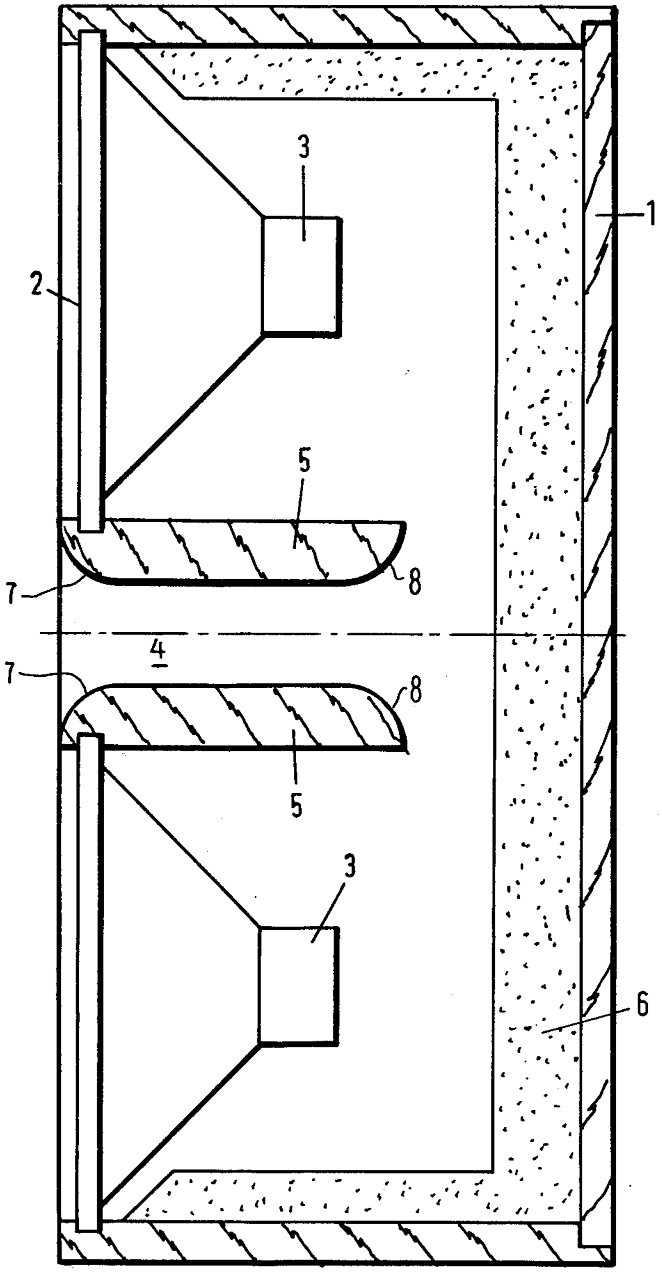
FIG. 1 shows a preferred embodiment of a speaker system according to the invention.

A number of speakers 3 is mounted in enclosure 1, FIG. 1 showing, by way of example, two speakers 3 mounted in superposition.

In accordance with the invention, the speaker system includes a duct 4 extending from the front of enclosure 1 into the interior thereof without being closed by cloth 2. In the present embodiment, the front is planar and the duct is defined by two parallel mounted members 5 extending substantially normal to the front of enclosure 1 and running substantially the dimension of enclosure 1 that is normal to the plane of the drawing.

In accordance with the invention, member 5 have at least one and preferably both edges 7, 8 rounded in the manner shown in FIG. 1.

Practice has shown that with such a configuration of the duct, the annoying rattling effect is essentially eliminated.

Furthermore, practice has shown that the result is optimal if the cross-sectional dimension of the opening of the duct at the edges of members 5 is selected to be at least one and a half times that of the central section of duct.

As known in the art, enclosure 1 may be provided with a coating 6 of damping material so as to render the higher frequencies inoperative at the rear of the enclosure. Practice has shown that such a provision does not adversely affect the effect achieved by the duct according to the invention.

Figure 2:
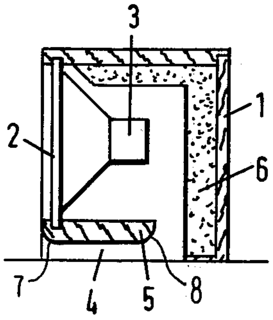
FIG. 2 shows an embodiment according to the invention that essentially corresponds with one half of the structure shown in FIG. 1.

It is not imperative to use a duct as shown in FIG. 1. FIG. 2 shows a structure that may be used as well. This structure is essentially one half of that shown in FIG. 1, the chain line shown in FIG. 1 to indicate the central plane of duct 4 now constituting the base of the speaker enclosure. As otherwise the structure shown in FIG. 2 is similar to that shown in FIG. 1, corresponding components are designated by corresponding reference numerals.

It is observed that the effect achieved by means of the structure shown in FIG. 2 is less than that achieved by the structure of FIG. 1, the latter having a high degree of symmetry.

It will be clear that the invention provides a solution that is particularly simple from a structural point of view and results in an effect that hitherto has either been achieved only partly, or led to annoying side effects, or required the use of means entailing drawbacks of a structural nature.

I CLAIM:

1. A bass reflex speaker system comprising:

a housing having a front wall, a rear wall and spaced apart side walls;

a pair of spaced apart speakers mounted on said housing front wall; and a duct defining means mounted on said housing front wall to be positioned between said speakers, said duct defining means including a top wall and a bottom wall, said walls being essentially parallel and spaced apart, said walls each having a front end mounted in said housing front wall and a rear end spaced from said housing rear wall, said duct walls extending essentially the entire distance between said housing side walls, said duct top wall having front and rear end edges which are each curved upwardly and said bottom wall having front and rear edges which are each curved downwardly so that a duct formed by said duct defining means has a cross-sectional dimension at the ends thereof which exceeds the cross-sectional dimension at the central portion of said duct and said cross-sectional dimension varies symmetrically from one end of said duct to the other end of said duct, whereby spurious side effects are minimized.

2. A speaker according to claim 1, characterized in that the rounding is such that the cross-sectional dimension of the opening of the duct at the respective edges is at least one and a half times that of the central section of said duct.

* * * * *